(12) United States Patent
Gulati et al.

(10) Patent No.: US 9,698,797 B1
(45) Date of Patent: Jul. 4, 2017

(54) HIERARCHICAL FEEDBACK-CONTROLLED OSCILLATOR TECHNIQUES

(71) Applicant: Apple Inc., Cupertino, CA (US)

(72) Inventors: Manu Gulati, Saratoga, CA (US);
Suhas Kumar Suvarna Ramesh, Santa Clara, CA (US); Venkata Ramana Malladi, Santa Clara, CA (US); Thomas H. Huang, Campbell, CA (US); Rakesh L. Notani, Sunnyvale, CA (US); Robert E. Jeter, Santa Clara, CA (US); Kai Lun Hsiung, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/210,852

(22) Filed: Jul. 14, 2016

(51) Int. Cl.
*H03L 7/00* (2006.01)
*H03L 7/07* (2006.01)
*H03L 7/099* (2006.01)

(52) U.S. Cl.
CPC ............... *H03L 7/07* (2013.01); *H03L 7/099* (2013.01)

(58) Field of Classification Search
CPC ........................................................ H03L 7/07
See application file for complete search history.

(56) References Cited

U.S. PATENT DOCUMENTS

| | | | |
|---|---|---|---|
| 2008/0012549 A1* | 1/2008 | Kam ...................... | G01R 29/26 324/76.54 |
| 2016/0019183 A1 | 1/2016 | Thurston et al. | |
| 2016/0055114 A1 | 2/2016 | Freiwald et al. | |
| 2016/0147249 A1 | 5/2016 | Gendler | |

* cited by examiner

*Primary Examiner* — Daniel Puentes
(74) *Attorney, Agent, or Firm* — Meyertons, Hood, Kivlin, Kowert & Goetzel, P.C.; Michael B. Davis

(57) ABSTRACT

Techniques are disclosed relating to feedback-controlled oscillators (e.g., phase-locked loops) arranged in two or more levels. In some embodiments, in a relatively higher-frequency mode, a first level feedback-controlled oscillator provides reference signals to one or more second level feedback-controlled oscillators that in turn generate output clock signals to clock sequential circuitry. In some embodiments, in a relatively lower-frequency mode, the first level feedback-controlled oscillator bypasses the second level feedback-controlled oscillators and provides output clock signals directly to sequential circuitry (without using any intervening feedback-controlled oscillators).

20 Claims, 6 Drawing Sheets

400

```
┌─────────────────────────────────────────────────────────────┐
│ Operate a plurality of sequential circuit portions in a first mode in which a │
│ master feedback-controlled oscillator generates a master output clock signal │
│ and a plurality of slave feedback-controlled oscillators provide slave output │
│ clock signals, based on the master output clock signal, to clock ones of the │
│         plurality of sequential circuit portions at a first frequency         │
│                                   410                                         │
└─────────────────────────────────────────────────────────────┘
                                  │
                                  ▼
┌─────────────────────────────────────────────────────────────┐
│  Operate the plurality of sequential circuit portions in a second mode that   │
│   includes clocking the plurality of sequential circuit portions at a second  │
│  frequency that is lower than the first frequency, based on the master output │
│    clock signal, without using any feedback-controlled oscillators to control │
│     clock signals between the master feedback-controlled oscillator and the   │
│                    plurality of sequential circuit portions                   │
│                                   420                                         │
└─────────────────────────────────────────────────────────────┘
```

FIG. 4

HIERARCHICAL FEEDBACK-CONTROLLED OSCILLATOR TECHNIQUES

BACKGROUND

Technical Field

This disclosure relates generally to clocking circuitry and more specifically to feedback-controlled oscillators (e.g., phase-locked loops) arranged in two or more levels.

Description of the Related Art

Computer processing devices typically include sequential circuitry such as latches and flip-flops that are configured to perform various operations based on clock signal inputs. Driving clock signals to different portions of a circuit often consumes a significant portion of overall power consumption. As clock speed increases, reducing deviation from the desired clock periodicity (often referred to as "jitter") in clock signals may become more important. Clock signals are typically controlled to a desired frequency using feedback-controlled oscillators, e.g., phase-locked loops (PLLs) or frequency-locked loops (FLLs). In some situations, multiple levels of feedback-controlled oscillators may be implemented to provide clock signals with low jitter characteristics. Each level in such a hierarchical configuration, however, may consume additional power.

SUMMARY

Techniques are disclosed relating to feedback-controlled oscillators (e.g., phase-locked loops) arranged in two or more levels. In some embodiments, in a relatively higher-frequency mode, a first-level feedback-controlled oscillator provides reference signals to one or more second-level feedback-controlled oscillators that in turn generate output clock signals to clock sequential circuitry. In some embodiments, in a relatively lower-frequency mode, the first-level feedback-controlled oscillator bypasses the second-level feedback-controlled oscillators and provides output clock signals directly to sequential circuitry (without using any intervening feedback-controlled oscillators). While the outputs of the second level feedback-controlled oscillators may exhibit less jitter, the greater amount of jitter in the second mode may be acceptable at lower frequencies. In some embodiments, the first level feedback-controlled oscillator is a system on a chip (SOC) clock while the second level of feedback-controlled oscillators are component clocks. In some embodiments, the disclosed techniques may reduce switching power consumption and/or reduce circuit area.

BRIEF DESCRIPTION OF THE DRAWINGS

FIG. 4 is a flow diagram illustrating an exemplary method for operating hierarchical feedback-controlled oscillators in different frequency modes, according to some embodiments.

Figure 1:
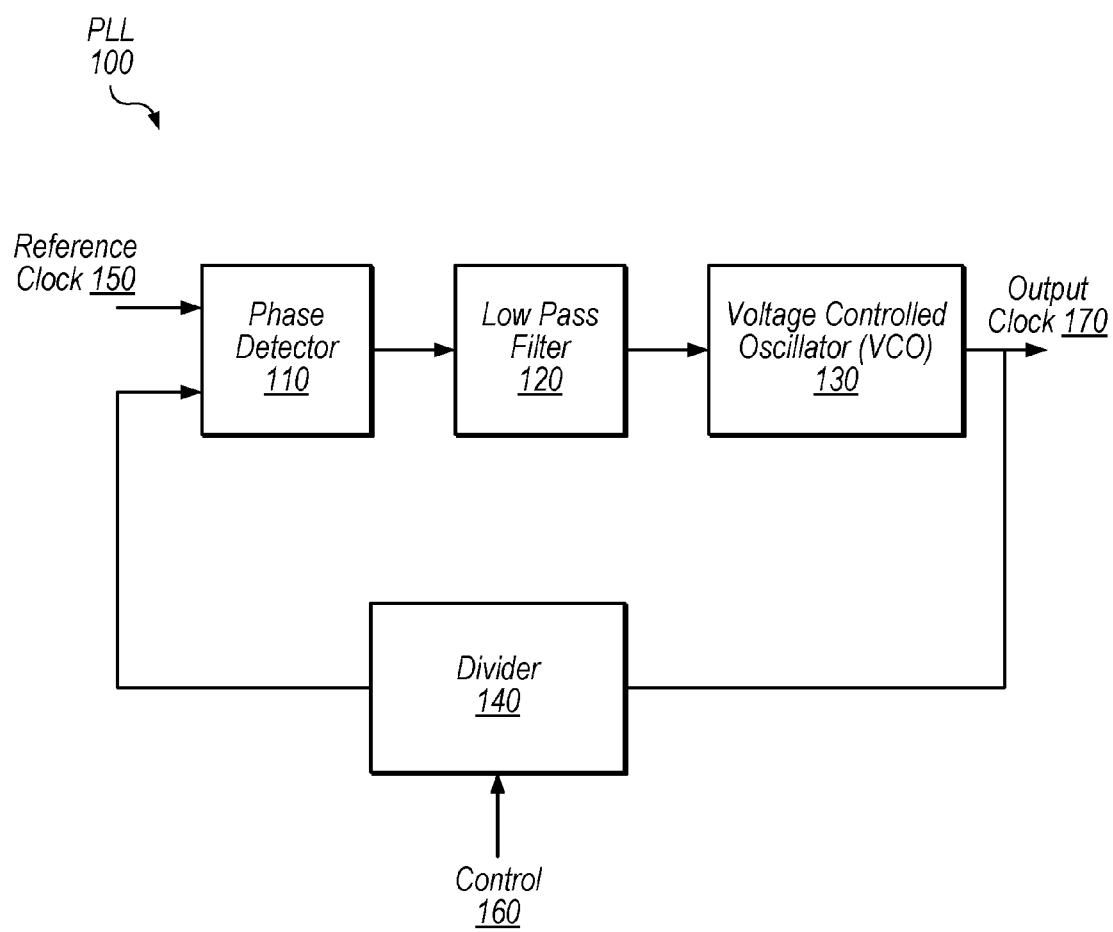
FIG. 1 is a block diagram illustrating an exemplary phase-locked loop, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

DETAILED DESCRIPTION

Exemplary Feedback-Controlled Oscillator

FIG. 1 is a block diagram illustrating an exemplary phase-locked loop (PLL) 100 according to some embodiments. PLLs are one example of feedback-controlled oscillators, but other types of feedback-controlled oscillators may be implemented in various embodiments, including frequency-locked loops (FLLs) for example. A feedback-controlled oscillator is an oscillator which is controlled, at least in part, based on a characteristic of its output. The oscillator portion of PLLs, for example, are controlled based on the phase of the oscillator output signal.

PLL 100, in the illustrated embodiment is configured to produce an output clock signal 170 based on two inputs: reference clock 150 and control signal 160. PLL 100, in the illustrated embodiment, includes phase detector 110, low pass filter 120, voltage-controlled oscillator (VCO) 130, and divider 140. In various embodiments, PLL 100 is configured to generate output clock 170 at a frequency that is a multiple of the frequency of reference clock 150. In fractional-N implementations, the multiple may be a non-integer multiple. In some embodiments, the multiple is adjustable, e.g., by altering control signal 160.

Phase detector 110, in the illustrated embodiment, is configured to generate an error signal that is proportional to the phase difference between the signal from divider 140 and reference clock 150. Low pass filter 120, in the illustrated embodiment is configured to block high-frequency components of the error signal to generate a control voltage for VCO 130. VCO 130, in the illustrated embodiment, is configured to generate output clock signal 170 based on the received control voltage. Divider 140, in the illustrated embodiment, receives the output clock signal 170 and divides it to generate the feedback input to phase detector 110. In some embodiment, divider 140 is programmable to divide by different values, which may be fractional in some embodiments, e.g., using control signal 160.

PLLs use a negative feedback loop that reduces fluctuations in the output (as opposed to positive feedback loops which amplify fluctuations). The negative feedback loop of PLLs may reduce variations in output clock 170 and lock clock signals to a desired frequency. Use of feedback-controlled oscillators such as PLLs may reduce jitter (deviation from the desired clock periodicity) in clock signals provided to various sequential circuitry (e.g., flip-flops, latches, etc.). The embodiment of FIG. 1 is provided for purposes of explanation but is not intended to limit the scope of the present disclosure. In other embodiments, any of various appropriate feedback-controlled oscillators may be implemented. Therefore, although PLLs are shown in various disclosed embodiments, other types of feedback-controlled oscillators may be substituted in other embodiments.

Exemplary Hierarchical Arrangement of Feedback-Controlled Oscillators

Figure 2:
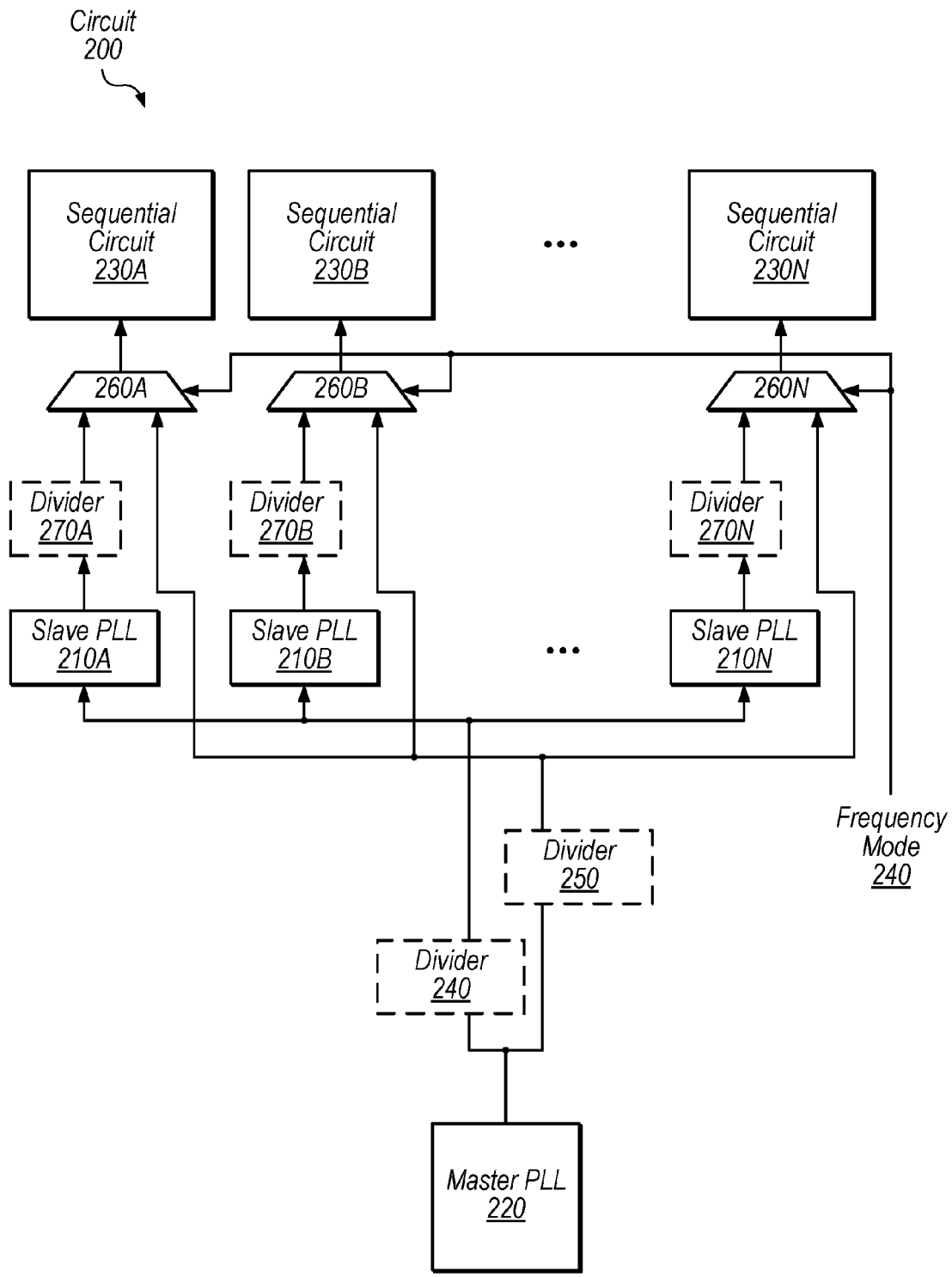
FIG. 2 is a block diagram illustrating an exemplary circuit that includes a hierarchical arrangement of PLLs, according to some embodiments.

FIG. 2 is a block diagram illustrating an exemplary circuit 200 that includes multiple hierarchical levels of feedback-controlled oscillators, according to some embodiments. In hierarchical arrangements, a feedback-controlled oscillator at one level is used to generate a reference signal for a feedback-controlled oscillator at another level. In the illustrated embodiment, circuit 200 includes a master PLL 220, multiple slave PLLs 210A-210N, multiple sequential circuit portions 230A-230N, multiplexers (MUXs) 260A-260N, and optionally includes divider 240, divider 250, and/or dividers 270A-270N.

Master PLL 220, in the illustrated embodiment, is configured to generate a master output clock signal (e.g., based on a reference signal such as a crystal oscillator, not shown). In the illustrated embodiment, master PLL 220 and slave PLLs 210 are hierarchically arranged such that the slave PLLs 210 are configured to use the master output clock signal (or a derivation thereof, e.g., as produced by divider 240) to generate respective slave output clock signals. In some embodiments, slave PLLs 210 are configured to produce output clock signals having the same frequency. In other embodiment's, slave PLLs 210 may produce output clock signals at different frequencies and/or their outputs may be divided at different rates by clock dividers 270 before being provided to various sequential circuit portions.

In some embodiments, master PLL 220 is a main system on a chip (SOC) clock configured to provide clock signals to multiple different SOC components. In some embodiments, slave PLLs 210 are included in different components or in the same component. For example, one or more slave PLLs 210 may be located in a physical layer interface (PHY) for one or more memory elements. In other embodiments, master PLL 220 and one or more slave PLLs 210 may be located in different integrated circuits or even on different devices.

In the illustrated embodiment, based on the mode indicated by frequency mode signal 240, multiplexers 260 are configured to provide either slave output clock signals (or derivations thereof) or the master output clock signal (or a derivation thereof, e.g., as produced by divider 250) to sequential circuit portions 230. In some embodiments, this may allow the slave PLLs 210 to be bypassed, e.g., in a lower frequency mode where clock jitter is more acceptable, to clock the sequential circuit portions 230 based on the master output clock signal, without any intervening feedback-controlled oscillators. In some embodiments, this may substantially reduce power consumption, e.g., because slave PLLs 210 can be clock gated in the low frequency mode, reducing power consumption caused by clock distribution.

In some embodiments circuit 200 is configured to operate in a plurality of different frequency modes, as shown in Table 1 below. In some exemplary embodiments, a highest-frequency mode 1, for example, may clock the sequential circuitry 230 at 1000 MHz. In this mode, to achieve desired jitter characteristics, the VCOs of the slave PLLs 210 may be clocked at 2000 MHz and the output divided by 2 by dividers 270. In some embodiments, the reference clock received from master PLL 220 in mode 1 may be at approximately 100 MHz. In some embodiments, a second frequency mode 2 may clock the sequential circuitry 230 at 500 MHz. In this mode, the VCOs of the VCOs of the slave PLLs 210 may be clocked at 500 MHz and the output is not divided (e.g., by bypassing dividers 270 or setting them to divide by 1).

In some embodiments, a third frequency mode 3 may clock the sequential circuitry 230 at 200 MHz and may bypass the slave PLLs in this mode by providing the master PLL output clock at 200 MHz to the sequential circuitry 230 without any intervening feedback-controlled oscillators. In some such embodiments, mode 2 may consume approximately ⅜ the power of mode 1 and mode 3 may consume approximately ⅛ of the power of mode 1 for clock distribution. In some embodiments, divider 250 is omitted. In other embodiments, divider 250 is configured to divide the master PLL signal and provide a divided signal to sequential circuit portions 230 via multiplexers 260. Although in the embodiments discussed above a clock signal is provided to the different sequential circuit portions 230 at the same frequency, different frequencies may be provided in some embodiments using different PLL configurations to provide clocks to different portions, different dividers on output clocks, etc. Clock dividers may be implemented using various circuit elements, such as D flip-flops with feedback loops, for example (note that such flip-flops are not encompassed by the term "feedback-controlled oscillators," even though they have a feedback path, because they are not oscillators: they do not produce oscillating signals based on control signaling, but rather simply modify received oscillator signals).

Table 1 below sets out characteristics of the exemplary frequency modes discussed above.

TABLE 1

| Mode | Slave VCO frequency | Slave output divider | Frequency received at sequential circuitry |
| --- | --- | --- | --- |
| Mode 1 | 2000 | 2 | 1000 MHz |
| Mode 2 | 500 | 1 | 500 MHz |
| Mode 3 | N/A | N/A | 200 MHz (from master) |

Although the illustrated embodiment of FIG. 2 includes two levels of feedback-controlled oscillators in a master/slave relationship, similar techniques may be used to bypass one or more levels in hierarchies of feedback-controlled oscillators having any of various appropriate numbers of levels. Similarly, any of various appropriate different frequency modes for clocking circuitry and any of various different frequencies may be implemented in various embodiments. The disclosed modes are discussed for purposes of illustration but are not intended to limit the scope of the present disclosure. Dividers 240, 250, and 270 may be omitted in some embodiments and additional dividers may be implemented in addition to and/or in place of the illustrated dividers. In some embodiments, dividers may be combined or replaced with a programmable divider configurable to divide at multiple different rates.

Exemplary Frequency Modes

Figure 3:
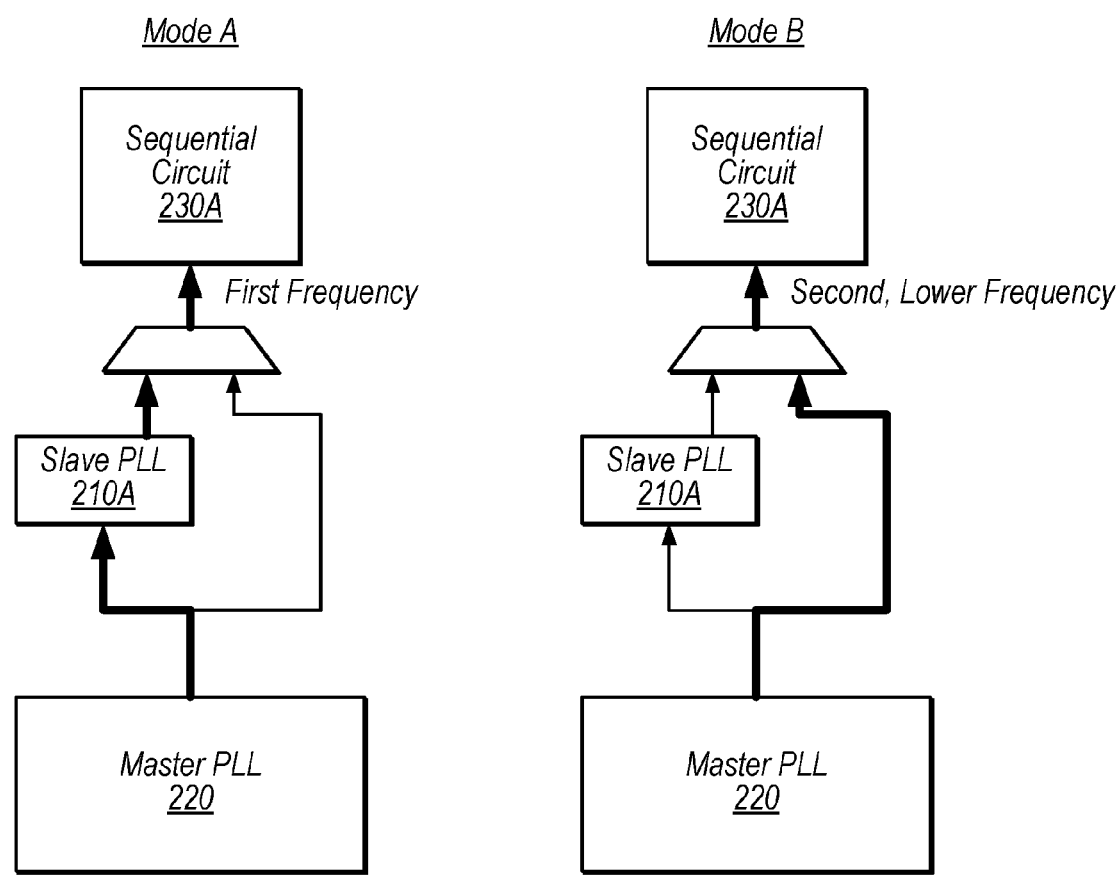
FIG. 3 is a block diagram illustrating exemplary different frequency modes, according to some embodiments.

FIG. 3 is a block diagram illustrating a simplified view of a portion of circuitry 200 for two different frequency modes A and B. In the illustrated embodiment, the clock lines shown in bold are used to clock sequential circuit 230A in a given frequency mode. In mode A, in the illustrated embodiment, the multiplexer selects input from slave PLL 210A and provides the input to sequential circuit 320A. In mode A in this embodiment, the slave PLL 210A receives a reference signal from master PLL 220. In mode B, in the illustrated embodiment (which may clock sequential circuit 230A at a lower frequency), the multiplexer selects input from master PLL 220 and provides the input to sequential circuit 320A. In some embodiments, circuit 200 is configured to clock gate slave PLL 210A or otherwise control PLL 210A to enter a lower power state in mode B. In some embodiments, master PLL 220 is configured to generate an output clock signal at different frequencies for the two different modes. In other embodiments, master PLL 220 is configured to generate an output clock signal at the same frequency for the two different modes.

In some embodiments, when transitioning from mode B to mode A, circuit 200 is configured to lock slave PLL 210A to a desired frequency before performing the switch. This may avoid a need to wait for a lock for slave PLL 210A after switching to mode A, in some embodiments. In some embodiments, when switching between two different frequency modes that both utilize slave PLL 210A, circuit 200 is configured to relock slave PLL 210A to the new frequency, which may take a few milliseconds.

The terms "master" and "slave" are used herein as labels for oscillators that provide and receive a reference signal from each other, respectively. Thus, if master PLL 220 receives a reference signal from another PLL, it may be referred to as a slave relative to the other PLL. Therefore a given PLL may be both a master with reference to a first set of one or more other PLLs and a slave with reference to a second set of one or more other PLLs.

In various embodiments, the disclosed techniques may reduce clock tree power consumption in relatively lower frequency modes while providing clock signals with acceptable jitter characteristics in relatively higher frequency modes. This may be especially advantageous in mobile devices that run on battery power, for example, because it may allow such devices to substantially extend battery life in lower-power or idle modes, for example.

In some embodiments, the disclosed techniques may also reduce the chip area used for slave PLLs 210 and corresponding internal and/or external dividers. Speaking generally, the area needed for a PLL module is related to the range of frequencies that it can be programmed to output. Therefore, in embodiments in which the output of master PLL 220 is used in lower frequency modes, the range supported by slave PLLs 210 may be reduced, resulting in a smaller chip area.

Exemplary Method

FIG. 4 is a flow diagram illustrating one exemplary embodiment of a method 400 for operating multiple levels of feedback-controlled oscillators in different frequency modes. The method shown in FIG. 4 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 410, in the illustrated embodiment, electronic circuitry operates a plurality of sequential circuit portions in a first mode in which a master feedback-controlled oscillator generates a master output clock signal and a plurality of slave feedback-controlled oscillators provide slave output clock signals, based on the master output clock signal. For example, if the slave feedback-controlled oscillators are PLLs, they may use the master output clock signal as a reference signal and compare the phase of the master output clock signal, or a derivation thereof (e.g., as generated by a clock divider circuit), with a phase of a slave output clock signal. In the illustrated embodiment, the slave output clock signals are used to clock ones of the plurality of sequential circuit portions at a first frequency.

At 420, in the illustrated embodiment, the electronic circuitry operates the plurality of sequential circuit portions in a second mode that includes clocking the plurality of sequential circuit portions at a second frequency that is lower than the first frequency. In the illustrated embodiment, the sequential circuit portions are clocked based on the master output clock signal, without using any feedback-controlled oscillators to control clock signals between the master feedback-controlled oscillator and the plurality of sequential circuit portions. Thus, in the second mode, the master clock signal may be divided or otherwise modified before being used to clock the sequential circuitry, but does not pass through any other feedback-controlled oscillators. This may be referred to as bypassing the slave feedback-controlled oscillators. The circuitry may clock-gate the slave feedback-controlled oscillators in the second mode.

In some embodiments, divider circuitry may divide the outputs of the slave feedback-controlled oscillators and/or the master feedback-controlled oscillators before providing the divided outputs as a clocking signal and/or a reference signal.

Exemplary Device

Figure 5:
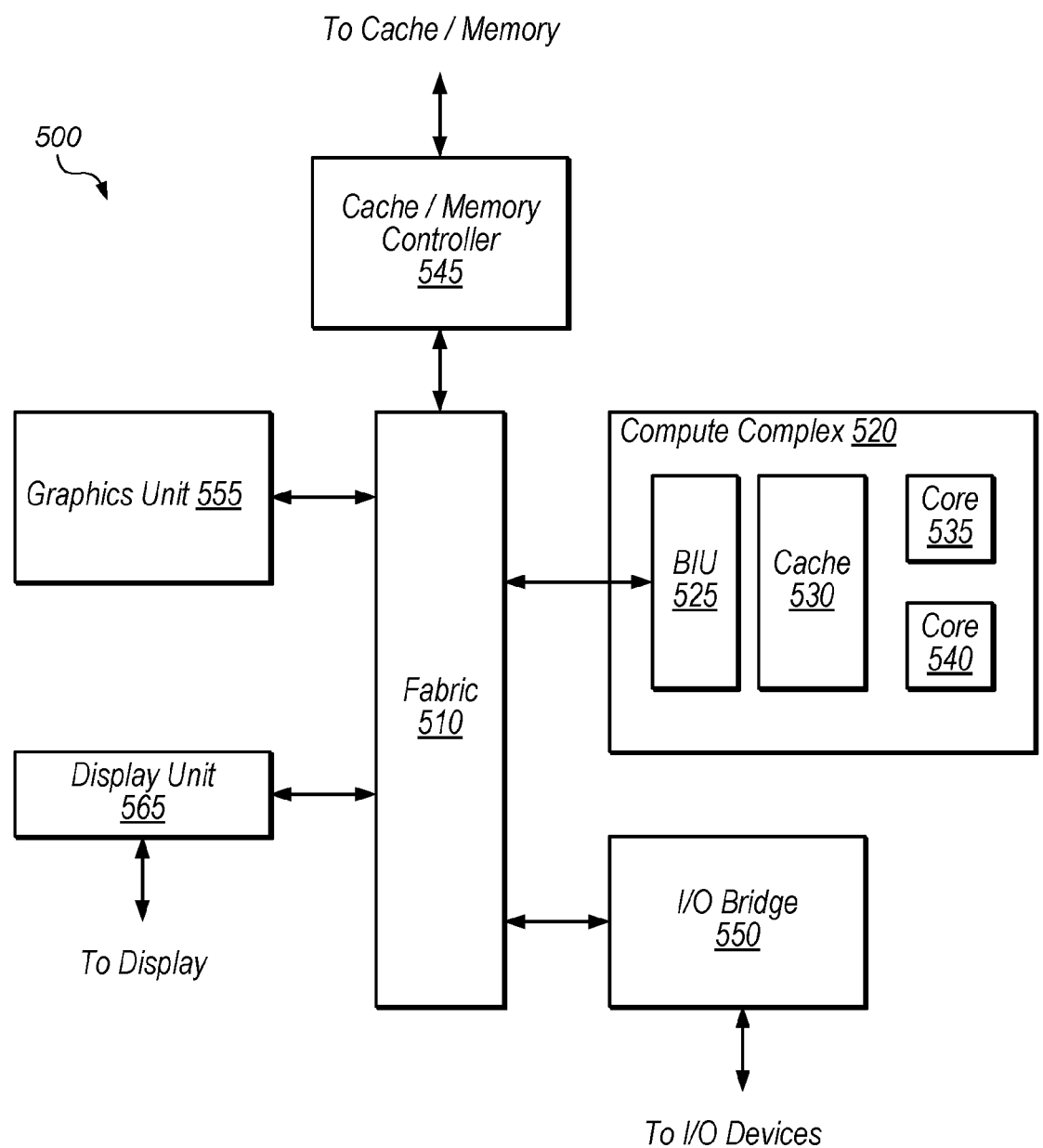
FIG. 5 is a block diagram of an exemplary device that includes one or more loop-controlled oscillators, according to some embodiments.

Referring now to FIG. 5, a block diagram illustrating an exemplary embodiment of a device 500 is shown. In some embodiments, elements of device 500 may be included within a system on a chip. In some embodiments, device 500 may be included in a mobile device, which may be batterypowered. Therefore, power consumption by device 500 may be an important design consideration. In the illustrated embodiment, device 500 includes fabric 510, compute complex 520 input/output (I/O) bridge 550, cache/memory controller 545, graphics unit 555, and display unit 565.

Fabric 510 may include various interconnects, buses, MUX's, controllers, etc., and may be configured to facilitate communication between various elements of device 500. In some embodiments, portions of fabric 510 may be configured to implement various different communication protocols. In other embodiments, fabric 510 may implement a single communication protocol and elements coupled to fabric 510 may convert from the single communication protocol to other communication protocols internally.

In the illustrated embodiment, compute complex 520 includes bus interface unit (BIU) 525, cache 530, and cores 535 and 540. In various embodiments, compute complex 520 may include various numbers of processors, processor cores and/or caches. For example, compute complex 520 may include 1, 2, or 4 processor cores, or any other suitable number. In one embodiment, cache 530 is a set associative L2 cache. In some embodiments, cores 535 and/or 540 may include internal instruction and/or data caches. In some embodiments, a coherency unit (not shown) in fabric 510, cache 530, or elsewhere in device 500 may be configured to maintain coherency between various caches of device 500. BIU 525 may be configured to manage communication between compute complex 520 and other elements of device 500. Processor cores such as cores 535 and 540 may be configured to execute instructions of a particular instruction set architecture (ISA) which may include operating system instructions and user application instructions.

Cache/memory controller 545 may be configured to manage transfer of data between fabric 510 and one or more caches and/or memories. For example, cache/memory controller 545 may be coupled to an L3 cache, which may in turn be coupled to a system memory. In other embodiments, cache/memory controller 545 may be directly coupled to a memory. In some embodiments, cache/memory controller 545 may include one or more internal caches.

As used herein, the term "coupled to" may indicate one or more connections between elements, and a coupling may include intervening elements. For example, in FIG. 5, graphics unit 555 may be described as "coupled to" a memory through fabric 510 and cache/memory controller 545. In contrast, in the illustrated embodiment of FIG. 5, graphics unit 555 is "directly coupled" to fabric 510 because there are no intervening elements.

Graphics unit 555 may include one or more processors and/or one or more graphics processing units (GPU's). Graphics unit 555 may receive graphics-oriented instructions, such as OPENGL®, Metal, or DIRECT3D® instructions, for example. Graphics unit 555 may execute specialized GPU instructions or perform other operations based on the received graphics-oriented instructions. Graphics unit 555 may generally be configured to process large blocks of data in parallel and may build images in a frame buffer for output to a display. Graphics unit 555 may include transform, lighting, triangle, and/or rendering engines in one or more graphics processing pipelines. Graphics unit 555 may output pixel information for display images. In the some embodiments, graphics unit 555 includes a programmable shader core.

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display).

I/O bridge 550 may include various elements configured to implement: universal serial bus (USB) communications, security, audio, and/or low-power always-on functionality, for example. I/O bridge 550 may also include interfaces such as pulse-width modulation (PWM), general-purpose input/output (GPIO), serial peripheral interface (SPI), and/or inter-integrated circuit (I2C), for example. Various types of peripherals and devices may be coupled to device 500 via I/O bridge 550.

In some embodiments, various elements of device 500 are clocked by feedback-controlled oscillators such as those included in slave PLLs 210 or master PLL 220. The disclosed techniques may reduce switching power consumption in device 500 and/or reduce area needed for clock distribution circuitry, in some embodiments.

Exemplary Computer-Readable Medium

The present disclosure has described various exemplary circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 6:
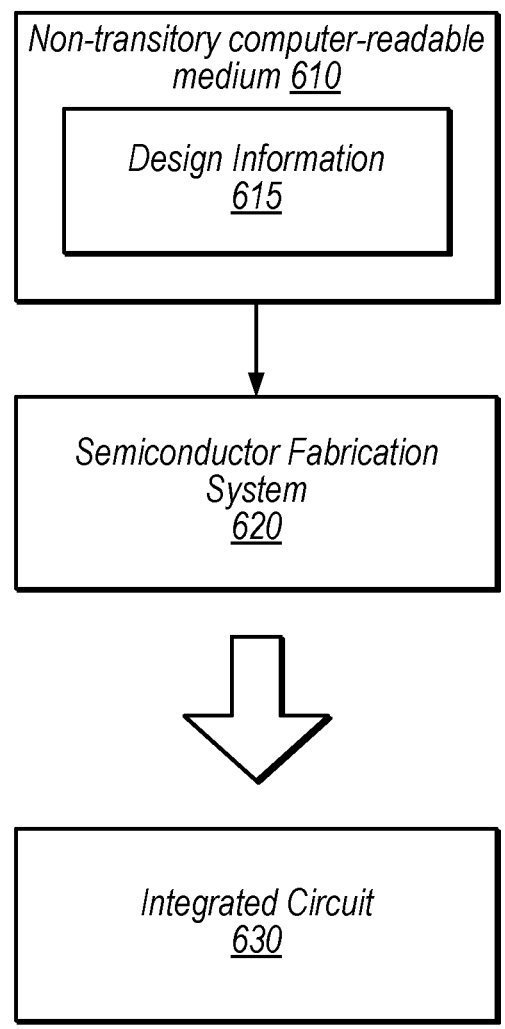
FIG. 6 is a block diagram illustrating an exemplary computer-readable medium that stores circuit design information, according to some embodiments.

FIG. 6 is a block diagram illustrating an exemplary non-transitory computer-readable storage medium that stores circuit design information, according to some embodiments. In the illustrated embodiment semiconductor fabrication system 620 is configured to process the design information 615 stored on non-transitory computer-readable medium 610 and fabricate integrated circuit 630 based on the design information 615.

Non-transitory computer-readable medium 610, may comprise any of various appropriate types of memory devices or storage devices. Medium 610 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Medium 610 may include other types of non-transitory memory as well or combinations thereof. Medium 610 may include two or more memory mediums which may reside in different locations, e.g., in different computer systems that are connected over a network.

Design information 615 may be specified using any of various appropriate computer languages, including hardware description languages such as, without limitation: VHDL, Verilog, SystemC, SystemVerilog, RHDL, M, MyHDL, etc. Design information 615 may be usable by semiconductor fabrication system 620 to fabrication at least a portion of integrated circuit 630. The format of design information 615 may be recognized by at least one semiconductor fabrication system 620. In some embodiments, design information 615 may also include one or more cell libraries which specify the synthesis and/or layout of integrated circuit 630.

Semiconductor fabrication system 620 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 620 may also be configured to perform various testing of fabricated circuits for correct operation.

In various embodiments, integrated circuit 630 is configured to operate according to a circuit design specified by design information 615, which may include performing any of the functionality described herein. For example, integrated circuit 630 may include any of various elements shown in FIGS. 1-3. Further, integrated circuit 630 may be configured to perform various functions described herein in conjunction with other components. For example, integrated circuit 630 may be coupled to voltage supply circuitry that is configured to provide a supply voltage (e.g., as opposed to including a voltage supply itself). Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a plurality of sequential circuit portions;
   a master feedback-controlled oscillator;
   a plurality of slave feedback-controlled oscillators;
   wherein the apparatus is configured to operate in a first mode in which the master feedback-controlled oscillator is configured to generate a master output clock signal and the plurality of slave feedback-controlled oscillators are configured to provide slave output clock signals to clock respective different ones of the sequential circuit portions at one or more first frequencies, wherein the slave output clock signals are based on the master output clock signal; and
   wherein the apparatus is configured to operate in a second mode in which the apparatus is configured to clock the sequential circuit portions at a second frequency without using any feedback-controlled oscillators to control clock signals between the master feedback-controlled oscillator and sequential circuit portions and in which the apparatus is configured to clock gate at least one of the plurality of slave feedback-controlled oscillators, wherein the second frequency is lower than each of the one or more first frequencies and is based on the master output clock signal.

2. The apparatus of claim 1, wherein at least one of the master feedback-controlled oscillator and plurality of slave feedback-controlled oscillators are included in a phase-locked loop (PLL).

3. The apparatus of claim 1, wherein at least one of the master feedback-controlled oscillator and plurality of slave feedback-controlled oscillators are included in a frequency-locked loop (FLL).

4. The apparatus of claim 1, further comprising a multiplexer configured to select between a clock line from one of the plurality of slave feedback-controlled oscillators and a clock line from the master feedback-controlled oscillator that bypasses the slave feedback-controlled oscillator.

5. The apparatus of claim 1, further comprising at least one clock divider circuit configured to generate the second frequency based on the master feedback-controlled oscillator in the second mode.

6. The apparatus of claim 1, further comprising at least one clock divider circuit configured to generate a reference signal for the plurality of slave feedback-controlled oscillators based on the master output clock signal.

7. The apparatus of claim 1, wherein the master feedback-controlled oscillator is configured to provide clock signals to multiple different portions of a system-on-a-chip and wherein the slave feedback-controlled oscillators are included in one of the portions of the system-on-a-chip.

8. The apparatus of claim 1, wherein at least one of the plurality of slave feedback-controlled oscillators is included in a memory interface.

9. A method, comprising:
   operating a plurality of sequential circuit portions in a first mode in which a master feedback-controlled oscillator generates a master output clock signal and a plurality of slave feedback-controlled oscillators provide slave output clock signals to clock respective different ones of the sequential circuit portions at one or more first frequencies, wherein the slave output clock signals are based on the master output clock signal; and
   operating the sequential circuit portions in a second mode that includes clock gating at least one of the plurality of slave feedback-controlled oscillators and clocking the sequential circuit portions at a second frequency without using any feedback-controlled oscillators to control clock signals between the master feedback-controlled oscillator and the sequential circuit portions, wherein the second frequency is lower than each of the one or more first frequencies and is based on the master output clock signal.

10. The method of claim 9, wherein the master feedback-controlled oscillator and plurality of slave feedback-controlled oscillators are each either included in a phase-locked loop (PLL) or a frequency-locked loop (FLL).

11. The method of claim 9, further comprising dividing the master output clock signal in the second mode to generate the second frequency.

12. The method of claim 9, further comprising dividing the master output clock signal to generate a reference signal for the plurality of slave feedback-controlled oscillators in the first mode.

13. The method of claim 9, further comprising dividing one or more of the slave output clock signals to generate the one or more first frequencies in the first mode.

14. The method of claim 9, master feedback-controlled oscillator is a system-on-a-chip (SOC) clock and wherein the slave feedback-controlled oscillators are clocks included in one or more SOC components.

15. A non-transitory computer readable storage medium having stored thereon design information that specifies a design of at least a portion of a hardware integrated circuit in a format recognized by a semiconductor fabrication system that is configured to use the design information to produce the circuit according to the design, including:
   a plurality of sequential circuit portions;
   a master feedback-controlled oscillator;
   a plurality of slave feedback-controlled oscillators;
   wherein the design information specifies that the circuit is configured to operate in a first mode in which the master feedback-controlled oscillator is configured to generate a master output clock signal and the plurality of slave feedback-controlled oscillators are configured to provide slave output clock signals to clock respective different ones of the sequential circuit portions one or more first frequencies, wherein the slave output clock signals are based on the master output clock signal; and
   wherein the design information specifies that the circuit is configured to operate in a second mode in which the circuit is configured to clock the sequential circuit portions at a second frequency without using any feedback-controlled oscillators to control clock signals between the master feedback-controlled oscillator and the sequential circuit portions and in which the circuit is configured to clock gate at least one of the plurality of slave feedback-controlled oscillators, wherein the second frequency is lower than each of the one or more first frequencies and is based on the master output clock signal.

16. The non-transitory computer readable storage medium of claim 15, wherein at least one of the master feedback-controlled oscillator and plurality of slave feedback-controlled oscillators are included in a phase-locked loop (PLL).

17. The non-transitory computer readable storage medium of claim 15, wherein the circuit further includes:
   a multiplexer configured to select between a clock line from one of the plurality of slave feedback-controlled oscillators and a clock line from the master feedback-controlled oscillator that bypasses the slave feedback-controlled oscillator.

18. The non-transitory computer readable storage medium of claim 15, wherein the circuit further includes at least one clock divider circuit configured to generate the second frequency based on the master feedback-controlled oscillator in the second mode.

19. The non-transitory computer readable storage medium of claim 15, wherein the circuit further includes at least one clock divider circuit configured to generate a reference signal for the plurality of slave feedback-controlled oscillators, in the first mode, based on the master output clock signal.

20. The non-transitory computer readable storage medium of claim 15, wherein the clock at the one or more first frequencies exhibits a lower amount of jitter than the clock at the second frequency.

* * * * *